(12) United States Patent
Mrakovich et al.

(10) Patent No.: US 7,850,341 B2
(45) Date of Patent: *Dec. 14, 2010

(54) ELONGATED LED ILLUMINATION DEVICE

(75) Inventors: Matthew Mrakovich, Streetsboro, OH (US); Ronald Brengartner, Jr., Strongsville, OH (US); Mark J. Mayer, Sagamore Hills, OH (US); William D. Sekela, Aurora, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/659,687

(22) PCT Filed: Aug. 4, 2005

(86) PCT No.: PCT/US2005/027610
§ 371 (c)(1),
(2), (4) Date: Aug. 17, 2007

(87) PCT Pub. No.: WO2006/017595
PCT Pub. Date: Feb. 16, 2006

(65) Prior Publication Data
US 2008/0030981 A1    Feb. 7, 2008

(51) Int. Cl.
*F21V 4/00* (2006.01)
*F21V 21/00* (2006.01)

(52) U.S. Cl. ............. 362/249.06; 362/235; 362/249.02; 362/555

(58) Field of Classification Search ................. 362/227, 362/228, 249, 250, 252, 555, 235
See application file for complete search history.

(56) References Cited

U.S. PATENT DOCUMENTS

| | | | |
|---|---|---|---|
| 6,361,186 B1 | 3/2002 | Slayden | |
| 6,583,550 B2 * | 6/2003 | Iwasa et al. | 313/485 |
| 6,761,472 B1 | 7/2004 | Cleaver et al. | |
| 6,840,655 B2 * | 1/2005 | Shen | 362/249 |
| 7,018,067 B2 * | 3/2006 | Wu | 362/249 |
| 7,021,792 B2 * | 4/2006 | Lin | 362/252 |
| 7,273,300 B2 * | 9/2007 | Mrakovich | 362/249.01 |
| 2002/0044456 A1 * | 4/2002 | Balestriero et al. | 362/555 |
| 2003/0198049 A1 | 10/2003 | Hulse et al. | |

FOREIGN PATENT DOCUMENTS

WO    WO 03/019506    3/2003

* cited by examiner

*Primary Examiner*—John A Ward
(74) *Attorney, Agent, or Firm*—Fay Sharpe LLP

(57) ABSTRACT

An illumination device (10) for simulating neon lighting comprises an elongated light guide (14) and a light engine (12), operatively connected the elongated light guide (14). The light engine includes a plurality of LEDs (18). The light engine is positioned in relation to the light guide (14) such that light emanating from the light engine (12) passes through the light guide (14).

19 Claims, 8 Drawing Sheets

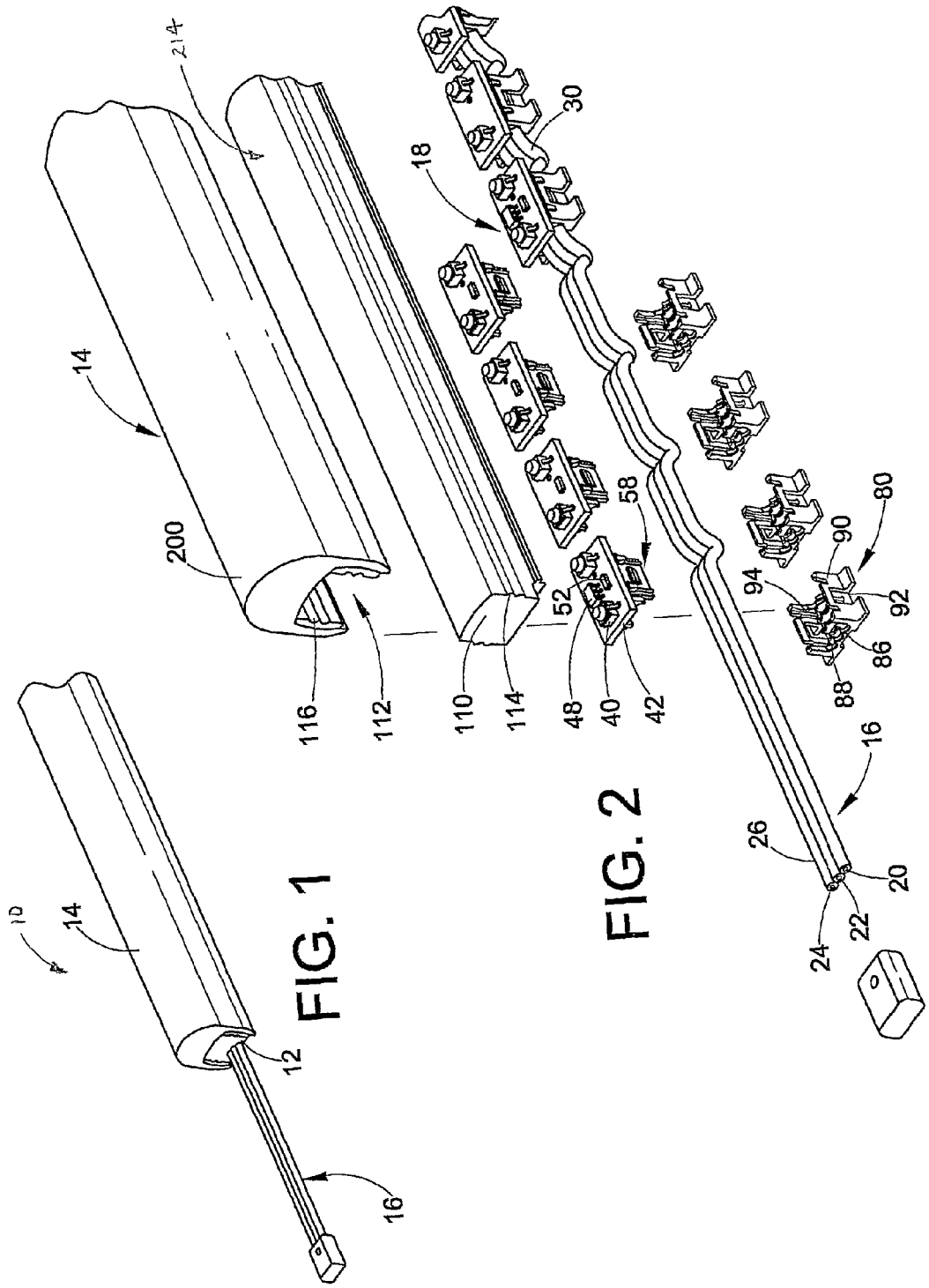

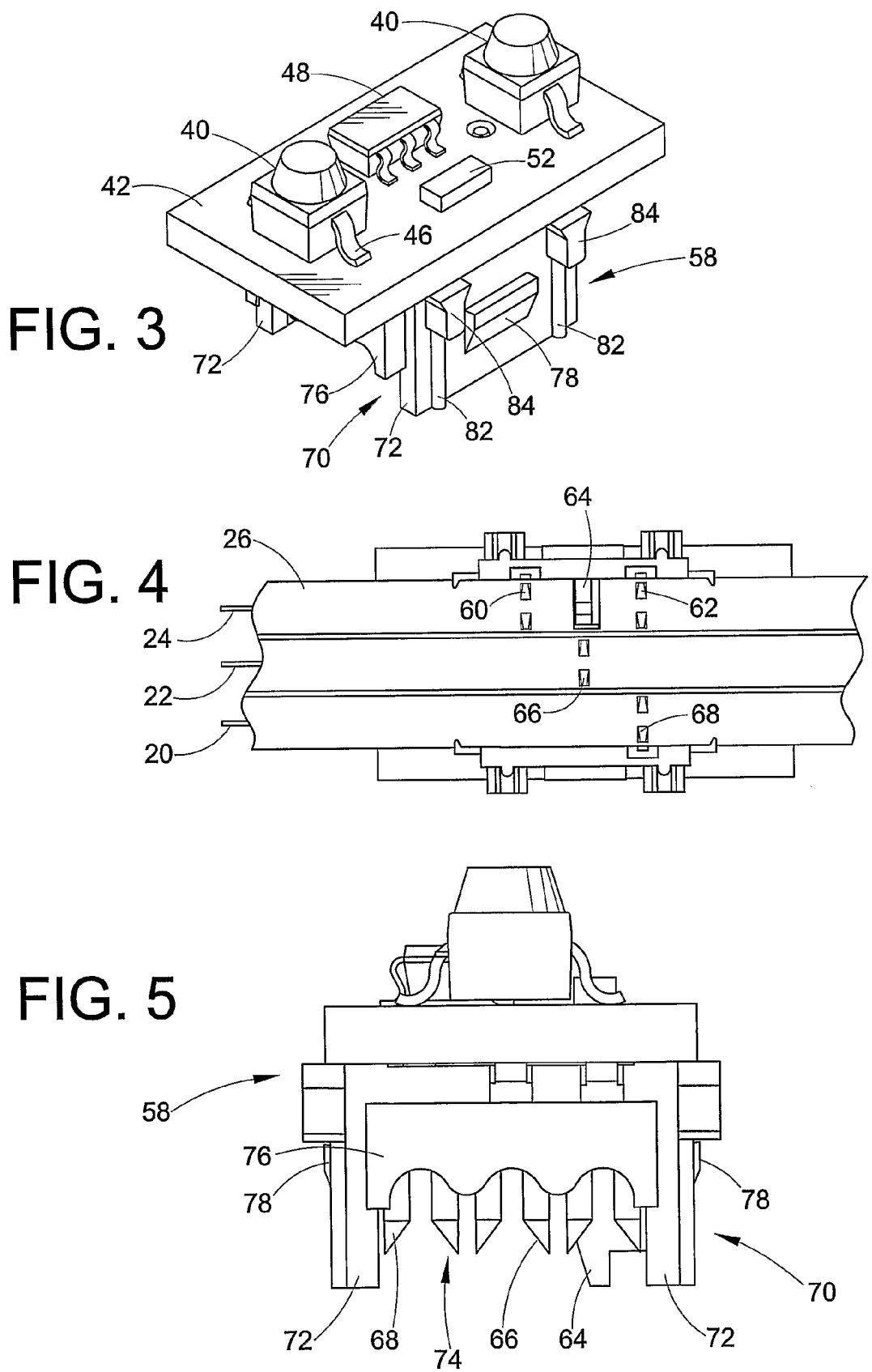

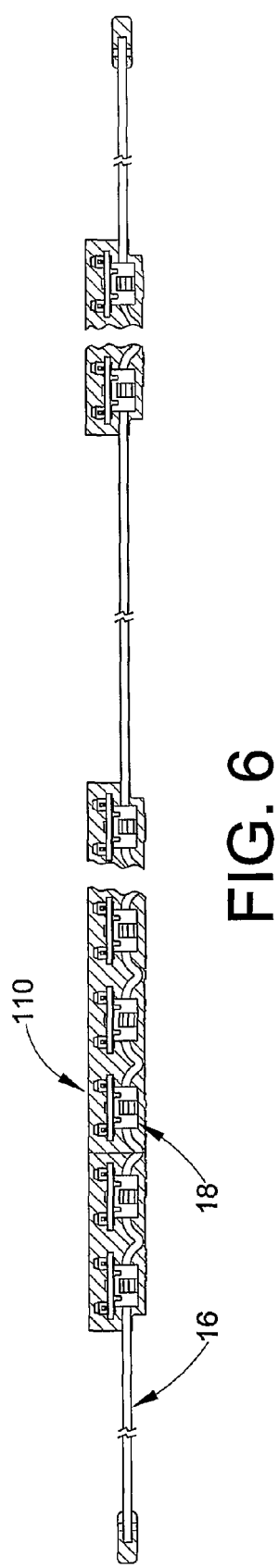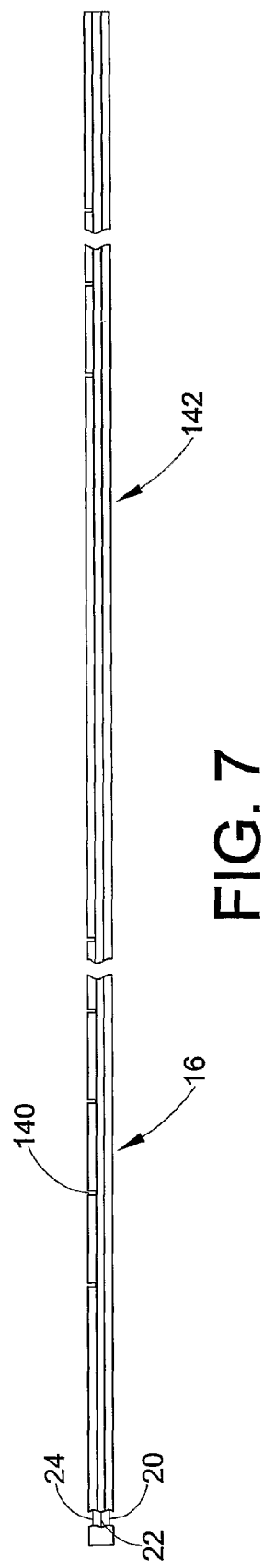

ELONGATED LED ILLUMINATION DEVICE

BACKGROUND OF THE INVENTION

Neon lights are formed into desirable shapes that can draw a person's attention to certain items. Neon lights are popular at stores, restaurants and other commercial establishments. Neon lights, however, are fragile, require high voltage and require skilled artisans to form and bend the light into letters. Also, neon lights can not typically be serviced on site.

LED light assemblies have been used to simulate neon lights. These known LED light assemblies include the following devices: an extruded plastic tube and a rigid printed circuit board ("PCB") disposed in the plastic tube, a solid light emitting rod having a light engine cooperating with the light emitting rod, and a rope light.

The extruded plastic tube device is typically used for border illumination. LEDs mount onto the rigid PCB and the PCB is inserted into the plastic tube. The extruded plastic tube device does not provide 360 degree light output, thus not simulating the 360 degree output of a neon light. Also, the extruded plastic tube device is formed into desired shapes in a factory and cannot be formed into other shapes in the field.

For the device that includes the light emitting rod having a light engine cooperating with it, the LED light source is inserted into a hollow housing that attaches to the light emitting rod. The LED light source is then encased in an epoxy that hardens after it has set. Since the LED light source is typically encased in a polymer that hardens after it has set, no adjustments can be made to the assembly after the polymer has set. The light emitting rod and the accompanying housing in these known assemblies must be formed into its desired shaped prior to inserting the LED light source. The formation process is typically done at the manufacturer's location, e.g. a factory, away from the location where the neon simulating device will be made, e.g. a sign installer's or sign maker's location. Accordingly, once the LED device is delivered to its final destination, minimal adjustments can be made to the device. Furthermore, the device is not serviceable after it has been installed.

The rope light typically includes a very flexible housing having LEDs disposed in the housing. Since the housing is so flexible, the device must be placed in a rigid channel so that it maintains its desired shape, for example the shape of a letter.

SUMMARY

In one embodiment, an illumination device for simulating neon lighting comprises an elongated light guide and a light engine operatively connected to and selectively removable from the elongated light guide. The light engine includes a plurality of LEDs. The light engine is positioned in relation to the light guide such that light emanating from the light engine passes through the light guide to simulate neon lighting.

An example of a method of assembling an illumination device for simulating neon lighting comprises includes the following steps: forming a light guide into a desired configuration, the light guide defining a central axis, and attaching a flexible light engine to the light guide. The light engine is attached such that it can selectively detach from the light guide by moving the light guide in a direction generally perpendicular to a central axis of the light guide. In this embodiment, the light engine comprises a plurality of LEDs connected to a flexible power conductor.

In another embodiment an illumination device includes an elongated body and a light engine attached to the elongated body. The elongated body includes a longitudinal channel and comprises a material adapted to bend into a number of desired configurations and adapted to scatter and transmit light. The light engine comprises at least one LED, a flexible power conductor in electrical communication with the at least one LED, and a resilient housing for the at least one LED. The resilient housing is at least partially received in the longitudinal channel of the elongated body.

BRIEF DESCRIPTION OF THE DRAWINGS

FIG. 1 is a perspective view of an illumination device useful for simulating neon lighting;

FIG. 2 is an exploded perspective view of the illumination device of FIG. 1;

FIG. 3 is a perspective view of a portion of an LED assembly of the illumination device of FIG. 1;

FIG. 4 is a bottom view of the assembly shown in FIG. 3 connected to a power conductor of the illumination device of FIG. 1;

FIG. 5 is an end view of the assembly of FIG. 3;

FIG. 6 is a longitudinal cross section of a light engine of the illumination device of FIG. 1;

FIG. 7 is a plan view of a power conductor of the illumination device of FIG. 1;

DETAILED DESCRIPTION

Figure 8:
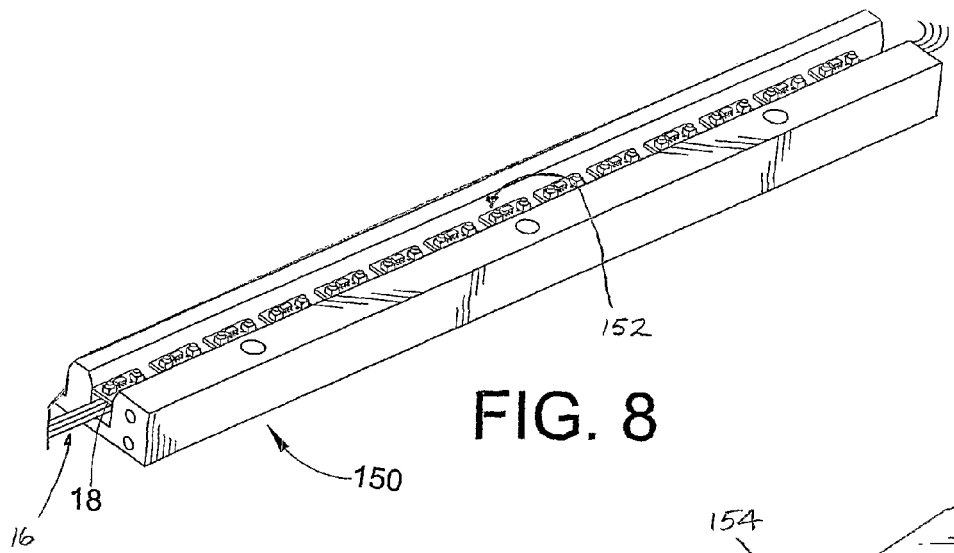
FIG. 8 is a perspective view of a mold used to manufacture the light engine depicted in FIG. 6.

With reference to FIG. 1, an illumination device 10 that simulates a neon light generally includes a light engine 12 and a light guide 14 that cooperates with the light engine. The illumination device 10 is flexible so that it can be bent, in a manner that will be described in more detail below, and shaped into many desirable configurations, for example into shapes of letters and other designs. FIG. 1 depicts only a portion of the illumination device 10 which can extend along a much greater distance than that depicted in FIG. 1. The illumination device 10 can be manufactured to have the length of many feet or meters long, typically sections of about eight feet. In one embodiment, the light sources, which will be described in more detail below, are spaced relatively close to one another to provide a desired beam overlap pattern.

As seen in FIG. 2, the light engine 12 includes a power conductor 16 and a plurality of LED assemblies 18 affixed to the power conductor. The power conductor 16 in the depicted embodiment includes three conductor wires: a positive (+) conductor wire 20, a negative (−) conductor wire 22 and a series conductor wire 24. Accordingly, the LED assemblies 18 can be arranged in a series/parallel arrangement along the power conductor 16. A fewer or greater number of wires can be provided, for example to transmit signals to the LED assemblies 18. The wires in the depicted embodiment are 22 gage, however other size wires can also be used. The conductor wires 20, 22 and 24 are surrounded by an insulating material 26.

In the depicted embodiment, the power conductor 16 is continuous between adjacent LED assemblies 18 such that the entire power conductor 16 is not cut or otherwise terminated to facilitate a mechanical or electrical connection between the LED assembly and the power conductor (a wire of the conductor is punched out, which will be described in more detail below). A continuous power conductor 16 quickens the manufacturing of the light engine 12, as compared to light engines that terminate the power conductor when connecting it to an LED module. As seen in FIG. 2, the power conductor 16 includes crimps 30 adjacent each LED assembly 18. The crimps 30 provide for stress relief which will be described in more detail below.

The LED assemblies 18 attach to the power conductor 16 spaced along the length of the power conductor. In the embodiment depicted and as seen in FIG. 2, each LED assembly 18 that attaches to the power conductor 16 includes at least one LED 40 (two LEDs are shown), which in the depicted embodiment is a surface mounted LED, placed on a support 42, which in the depicted embodiment is a printed circuit board ("PCB"). In the depicted embodiment, each of the PCBs 42 that mount to the power conductor 16 have similar dimensions (see FIG. 2); however, the circuitry located on each PCB and the components that mount to each PCB can be different. As seen in FIG. 3, leads 46 for each LED 40 electrically connect to printed circuitry (not shown) disposed on an upper dielectric surface of each PCB 42.

As seen in FIGS. 2 and 3, an LED driver 48 mounts on the upper surface of some of the printed circuit boards 42. The LED driver 48 is in electrical communication with the LEDs 40 through the printed circuitry. A resistor 52 also mounts on the upper surface of some of the printed circuit boards 42. The resistor 52 is also in communication with the LEDs 40 through the printed circuitry. In the depicted embodiment some PCBs 42 are provided with resistors and LED drivers and some PCBs are not (see FIG. 2). Accordingly, the circuitry located on each PCB 42 interconnecting the LEDs 40 to the power conductor 16 is different dependent upon the components mounted on the PCB.

With reference back to FIG. 1, in the depicted embodiment three different wiring configurations are provided for the PCBs 42: (1) a wiring configuration for the PCB having the resistor 52 and LED driver 48, which begins the series arrangement and (2) a wiring configuration for the internal PCBs of the series arrangement, which have no resistor or LED driver, and (3) a wiring configuration for the PCB at the end of the series arrangement, which also has no LED driver or resistor. In the depicted embodiment, two internal. PCBs are interposed between the PCB that begins the series arrangement and the PCB that ends the series arrangement. Other wiring configurations can be provided where, for example, all the PCBs are connected in series or in parallel, as well as having a greater or fewer number of PCBs connected in series while maintaining the series/parallel configuration.

In an alternative embodiment, the support upon which the LED is mounted can be a flex circuit or other similar support. Furthermore, the LEDs that mount to the support, either the flex circuit or the PCB, can include chip on board LEDs and through-hole LEDs. Also, other electronics can mount to the support including a device that can regulate the voltage as a function of the LED temperature or the ambient temperature. Furthermore, these-electronics, including the resistor, the LED driver, and any temperature compensating electronics can be located on a component that is in electrical communication with the LEDs but not located on the support. Where additional components are provided, additional wires for the power conductor can also be provided.

With reference back to the depicted embodiment as seen in FIG. 3, an IDC connector 58 depends from a lower surface of the support 42. In the depicted embodiment, the IDC connector 58 is mechanically fastened to the support 42, which operatively connects the IDC connector to the LEDs 40. Even though the IDC connector is depicted as directly attaching to the support 42, other elements or components can be interposed between the two. When the IDC connector 58 attaches to the power conductor 16, the support 42 resides in a plane generally parallel with the plane in which the wires 20, 22 and 24 of the power conductor 16 reside.

With reference to FIG. 4, in the depicted embodiment the IDC connector 58 includes a plurality of IDC terminals, which are bifurcated metal members (more clearly visible in FIG. 5) that are adapted to pierce the insulation 26 of the power conductor 16. A first series IDC terminal 60 depends from a lower surface of the support 42 and is in electrical communication with the LEDs 40 through the circuitry printed on the upper dielectric layer of the support 42. A second IDC terminal 62 is spaced from the first series IDC terminal 60 and also depends from the lower surface of the support 42. The second series IDC terminal 62 is also in communication with the LEDs 40. The first and second series IDC terminals 60 and 62 pierce the insulation 26 surrounding the series wire 24 to provide an electrical connection between the LEDs 40 and the series wire. The IDC connector 58 in this embodiment also includes an insulative barrier 64 disposed between the first series terminal 60 and the second series terminal 62.

A negative IDC terminal 66 also depends from a lower surface of the support 42. Similar to the first series IDC terminal 60 and the second series IDC terminal 62, the negative IDC terminal 66 is in electrical communication with the LEDs 40 via circuitry disposed on an upper dielectric surface of the support 42. The negative IDC terminal 66 displaces insulation surrounding the negative wire 22 to provide an electrical connection between the LEDs 40 and the negative wire. A positive IDC terminal 68 also depends from a lower surface of the support 42. The positive IDC terminal 68 is in electrical communication with the LEDs 40 via circuitry provided on an upper surface of the support 42. The positive IDC terminal 68 displaces insulation 26 surrounding the positive wire 20 to provide for an electrical connection between the LEDs 40 and the positive wire. In the depicted embodiment, each IDC connector 58 has the same electrical configuration. The support 42 to which the connector 58 attaches has a different electrical configuration based on the electrical components mounted on the support. For example, the IDC terminals for one connector can electrically communicate with the resistor 52 and/or the LED driver 48 that is located on some of the supports 42.

With reference to FIG. 5, the IDC connector 58 also includes an IDC connector housing 70 that includes dielectric side walls 72, which in the depicted embodiment are made of plastic, that depend from opposite sides of the support 42 in the same general direction as the IDC terminals. As seen in FIG. 5, the IDC terminals 60, 62, 66 and 68 are disposed between the sidewalls 72. With reference to FIG. 5, the sidewalls 72 are spaced from one another to define a channel 74 configured to snugly receive the power conductor 16. A power conductor seat 76 depends from a lower surface of the support 42 in the same general direction as the IDC connectors and the sidewalls 72. The seat 76 includes three curved recesses, one recess for each wire of the power conductor 16. With reference to FIG. 3, a tab 78 extends from each sidewall 72 to facilitate attaching the IDC connector housing 70 to an IDC cover 80 (FIG. 2). Each sidewall 72 also includes vertical ridges 82 formed on opposite sides of each tab 78. The vertical ridges 82 also facilitate attachment of the IDC connector housing 70 to the IDC cover 80. Stops 84 extend outwardly from each sidewall 72 at an upper end of each vertical ridge 82. The stops 84 extend further from each sidewall 72 than the vertical ridges 82.

As seen in FIG. 2, the IDC cover 80 includes a base wall 86 defining an upwardly extending power conductor seat 88 that includes curved portions for receiving the separate wires of the power conductor 16. The curved portions of the power conductor seat 88 align with the curved portions of the power conductor seat 74 of the IDC connector housing 70. Sidewalls 90 extend upwardly from opposite sides of the base wall 86 of the IDC cover 80. Each sidewall 90 includes an opening 92 configured to receive the tab 78 extending outwardly from each sidewall 72 of the IDC connector housing 70. Internal vertical notches 94 are formed on an inner surface of each sidewall 90 to receive the vertical ridges 82 formed on the sidewalls 72 of the IDC connector housing 70. Notches 96 are formed in each sidewall 90 of the IDC cover 80 to receive the stops 84 formed on the IDC connector housing 70.

The support 42 attaches to the power conductor 16 by pressing the support into the power conductor 16 such that the IDC terminals 60, 62, 66 and 68 displace the insulation 26 around each wire of the power conductor. The cover 80 is then pressed toward the support 42 such that the tabs 78 lock into the notches 92 to secure each support 42 to the power conductor 16. The tabs 78 are ramped to facilitate this connection.

With reference to FIG. 6, an overmolded housing 110 at least substantially surrounds, and in the depicted embodiment completely encapsulates, some of the LED assemblies 18 and a portion of the conductor 16. In the depicted embodiment, a portion of the conductor 16 extends from the overmolded housing 110 in two opposite longitudinal directions. The overmolded housing 110 in the depicted embodiment is made from a light transmissive silicone material; however, the overmolded housing can be made from other light transmissive materials. The silicone material provides for a flexible housing for the light engine; however, other flexible materials can be used.

With reference back to FIG. 1, the overmolded housing 110 is shaped to be received inside a longitudinal channel or cavity 112 that is formed in the light guide 14. In the depicted embodiment, the overmolded housing 110, and thus the light engine 12, fits via a friction and/or resilient fit inside the cavity 112 of the light guide 14 and can be selectively removed from the cavity. The light engine 12 can be easily replaced should any of the LEDs 40 burn out. Upon insertion into the cavity 112, the resilient overmolded housing 110 slightly compresses. Furthermore, by providing a light engine 12 that is easily insertable into and removable from the cavity 112, the illumination device 10 can be easily formed in the field just prior to installation. As seen in FIG. 2, the overmolded housing 110 includes light guide engagement members 114 which in the depicted embodiment are longitudinal ridges, formed in the overmolded housing. The light guide engagement members 112 engage light engine engagement members 116, which in the depicted embodiment are longitudinal grooves formed on an inner surface of the channel 112, to selectively fasten the light engine to the light guide.

To assemble the light engine 12 the series conductor wire 24 of the power conductor 16 is punched out to form slots 140 (FIG. 7) at predetermined locations along the power conductor 16. A blank wire section 142, i.e. a section having no slots formed in it, is disposed between a section of the power conductor 16 that has slots punched in it. The power conductor 16 is then bent to form crimps 30 (see FIG. 2). The LED assemblies 18 are then attached to the power conductor 16. The order of the aforementioned steps is not critical to the invention.

Each support 42 and the accompanying IDC connector housing 70 and IDC terminals 60, 62, 66 and 68 are disposed such that the connector insulation barrier member 64 (FIGS. 4 and 5) of each IDC connector is disposed inside the slot 140 and the appropriate IDC terminals contact the respective conductor wires of the power conductor 16. The IDC cover 80 is then fit over the IDC connector housing 70 so that the power conductor 16 is fully seated in each of the power conductor seats 74 and 88. The overmolded housing 110 is then formed over the supports 42 and the power conductor 16 adjacent the support.

Figure 9:
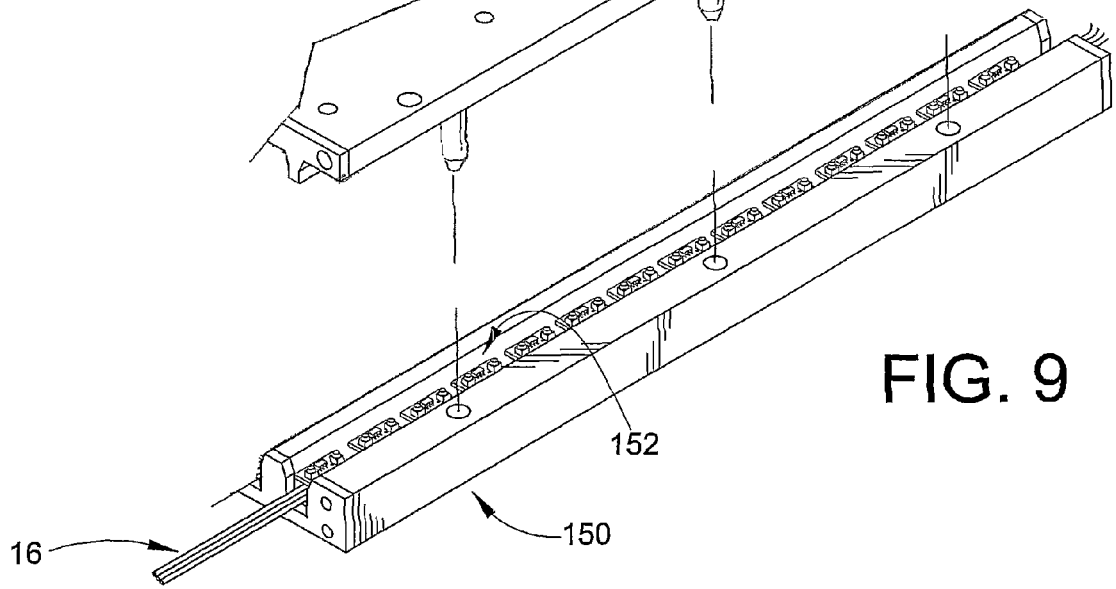
FIG. 9 is a perspective view of the mold of FIG. 8 and a cover for the mold.

With reference to FIG. 8, the power conductor 16 having the LED assemblies 18 attached is then placed into a mold 150 and a silicone elastomer is injected into the mold to form the overmolded housing 110. The power conductor 16 and the accompanying LED assemblies 18 are inserted into a cavity 152 of the mold 150. The cavities 152 of the mold 150 are appropriately shaped to provide the desired configuration for the overmolded housing. With reference to FIG. 9, a, cover 154 is placed over the mold 150 after the power conductor 16 and the LED assemblies 18 have been placed inside the mold. The cover 154 includes at least one opening 156 that communicates with the respective cavity 152. The silicone is injected into the opening 156 and thus into the cavity 152 of the mold 150. The silicone then cures and the light-engine 12 is removed from the mold.

Alternatively, the overmolded housing can be formed using a liquid injection molding process and/or a casting process. Also, the overmolded housing 110 can be extruded by running the power conductor 16 and the accompanying LED assemblies 18 through an extruder. The power conductor 16 may not be crimped when the overmolded housing is extruded. The overmolded housing 110 provides a further mechanical connection between the support 42 and the power conductor 16 as well as acting as a barrier from the elements for the components disposed inside the overmolded housing.

The crimps 30 in the power conductor 16 of the light engine 12 limit any forces on the conductor 16 from transferring to the IDC connector 58. This is to limit any stresses on the IDC connector 58 so that good mechanical and electrical connection is maintained between the supports 42 and the IDC connector during bending of the illumination device 10. An alternative manner of limiting forces on the conductor 16 from transferring to the IDC connector 58 includes separating the insulation 26 of the conductor 16 between adjacent wires 20, 22 and 24. Each conductor wire 20, 22 and 24 of the conductor 16 are separated and crimped. The crimps, similar to crimps 30, can be located adjacent every other LED assembly 18, or another multiple of LED assemblies. In addition to limiting the transfer of stresses, the separated wires and insulation provide for greater movement within the overmolded housing 110. In another alternative, to provide further stress relief, additional length of power conductor 16 can be provided between adjacent IDC connectors 58. To accommodate packaging the additional length of conductor, the IDC connectors 58 are rotated about the longitudinal axis of the center wire 22 to create a twist of the three wires 20, 22 and 24 between the IDC connectors 58.

Figure 10:
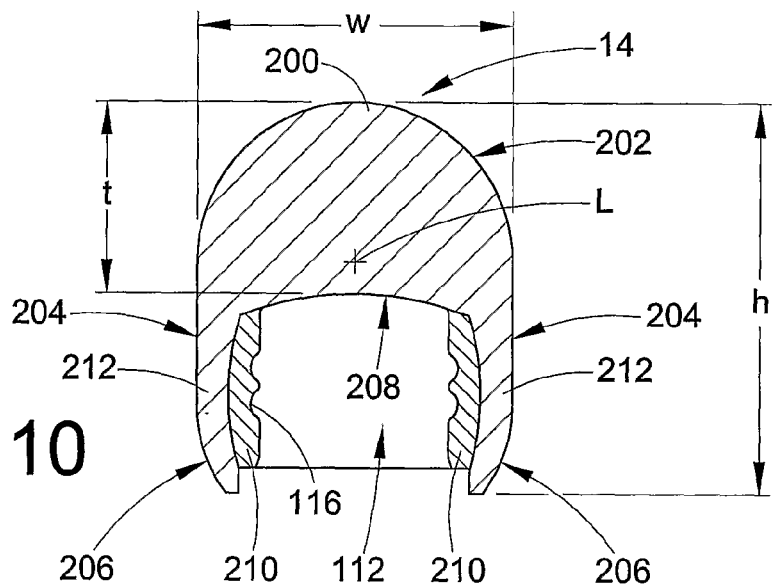
FIG. 10 is a cross section taken normal to a longitudinal axis of a light guide for the illumination device depicted in FIG. 1.

With reference back to FIG. 2, the light guide 14 includes an elongated body 200 formed to include the longitudinal channel 112 that is configured to receive the overmolded housings 110 of the light engine 12. In the embodiment depicted in FIG. 2, the body 200 is a solid member. With reference to FIG. 10, the light guide 14 includes a curved outer surface 202, which in the depicted embodiment is semi-circular having a radius about a longitudinal axis L disposed in the body 200 above the cavity 112. The curved outer surface 202 transitions into outer lateral surfaces 204, which are at least substantially planar in the depicted embodiment. Each lateral surface 204 transitions into a smaller curved surface 206 at an end opposite the transition with the lateral surface.

The light guide 14 also includes a curved inner surface 208 that defines a portion of the channel 112. In the depicted embodiment, the radius of curvature of the inner surface 208 is about twice as large as the radius of curvature of the curved outer surface 202. With reference to FIG. 10, the total height h of the light guide 14 is nearly equal to the greatest width w of the light guide, and in the depicted embodiment the ratio of the total height to the greatest width measures about 1.22:1. In alternative embodiments the ratio of the total height to the width can measure about 1.5:1 to about 1:1. A ratio that measures closer to 1:1 can provide for an illumination device that more closely looks like a neon light.

In the depicted embodiment; the distance between the center point of the curved inner surface 208 and the center point of the curved outer surface 202, which is measured along a line that intersects the longitudinal axis of the light guide body 200, will be referred to as the mid-plane thickness t. The ratio of the mid-plane thickness t to the radius of curvature of the outer surface 202 is nearly 1:1, and in the depicted embodiment measures 1.2:1. In alternative embodiments the ratio of the mid-plane thickness to the radius of curvature of the outer surface can measure about 1.5:1 to about 1:1, where the closer the ratio is to 1:1 the closer the illumination device looks like a neon light. In the depicted embodiment, the greatest width w of the light guide equals the diameter of the curved outer surface 202, and thus twice the radius of curvature r of the outer surface. Accordingly, in the depicted embodiment the ratio of t:w equals 0.6:1. In alternative embodiments the ratio of t:w can measure about 0.5:1 to about 0.75:1, where the closer the ratio is to 0.5:1 the closer the illumination device looks like a neon light.

In the depicted embodiment, the body 200 is made from a plastic material that includes light diffusing additives to randomly scatter the light in the body, for example a blended ASA (acrylic-styrene-acrylonitrite) having light diffusing beads. The material is selected for its diffusion, transmission and hiding properties. Accordingly, other material can be used that exhibit some or all of the desirable properties. The material of the body 200 diffuses light emanating from the LEDs 40 (FIG. 2) so that a glow that simulates neon light emanates from the outer surface of the light guide, which can include the curved outer surface 202, the lateral outer surfaces 204 and the smaller curved outer surfaces 206. The material of the body 200 also allows for transmission of the light along and around the outer surface of the body. Light enters the body 200 through the inner curved surface 208 and is indiscriminately scattered to give the appearance of a 360 degree light output. This 360 degree light output can provide a wall wash effect, i.e. where light is emitted from the back of the illumination device, which is desirable in that it more closely simulates a neon light.

In the embodiment depicted in FIG. 2, the LEDs 40 are spaced closely together so that the light guide 14 need not distribute the light along the length of the light guide. Instead, the light guide can indiscriminately scatter the light. In the depicted embodiment, the light pattern created by an LED 40 on the light emitting surface 202, 204 and 206 has a major axis, i.e. its greatest dimension, that is at least substantially perpendicular to the length, or longitudinal axis, of the light guide and creates a uniform light pattern around the circumference. This pattern creates a 360 degree illumination pattern. To achieve uniformity along the length of the light guide 14, the LEDs 40 have been spaced to overlap the minor axis of the light pattern from each LED. The combined effect results in a performance similar to neon. This results in a wall wash effect that more closely simulates neon light output. The light exits the light engine 12 via a light exiting surface 214 (FIG. 2) that has a complementary shape to the light entering surface 208 (FIG. 10) of the light guide. The complementarily shaped surfaces minimizes air gaps in the illumination device 10 and also minimizes any differences in the index of refraction to reduce losses in intensity.

Opaque members 210 are disposed on internal lateral surfaces of the cavity 112. The opaque side members 210 attach to the internal surface of two side members 212 of the body 200 that extend from the portion of the body generally disposed above the curved inner surface 208. The internal surface of the two side members 212 and the curved inner surface 208 define the channel 112 that receives the light engine 12. The opaque members 210 include the longitudinal grooves 116 that were described above. In the depicted embodiment, the opaque members 210 are made from a white opaque cap stock material that is coextruded with the remainder of the body 200. The opaque material blocks light emitted from the LEDs 40 to hide any hot spots, which correlate to the point light sources of the LEDs 40. The material can also be partially or fully reflective and/or partially transmissive. The opaque members 210 extend along an internal surface of each side member 212 from the inner curved surface 208 to nearly the end of each side member 212, ending slightly offset from the end of each side member 212.

The material of the light guide 14, i.e. both the body 200 and the opaque members 210 are formed, from a thermoformable material. The material can be heated using a conventional air heater or oven and shaped to a desirable shape. To shape the light guide, a bending aid member (not shown), which has a similar configuration to the overmolded housing 110, is inserted into the cavity 112 of the light guide 14. The light guide 14 is then heated, which for the material in the depicted embodiment is to a temperature around 300 degrees F. While hot, the light guide is bent into the desired configuration. The light guide can be bent in three mutually perpendicular axes, e.g. an x-axis, a y-axis and a z-axis, i.e. omnidirectional. The bend aiding member is then removed from the channel 112 and the light engine 12 is inserted into the channel. The bend aiding member ensures that the dimensions of the cavity 112 do not change during bending so that the cavity can receive the light engine 12 after it has been shaped into its desired configuration. If desired, the light guide 14 can be shaped while having the light engine 12 disposed in the cavity 112.

Figure 11:
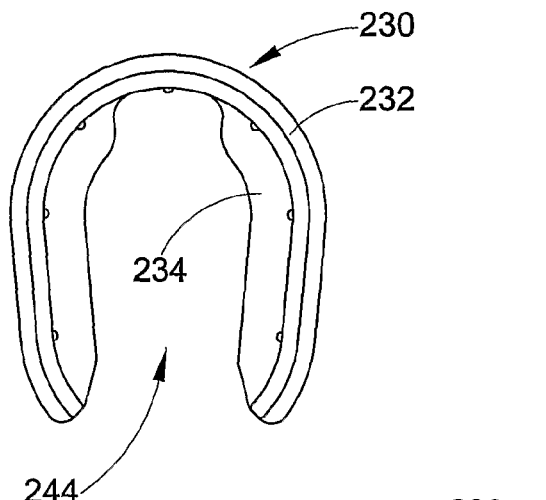
FIG. 11 is an end view of a couple for coupling together two adjacent illumination devices.
Figure 12:
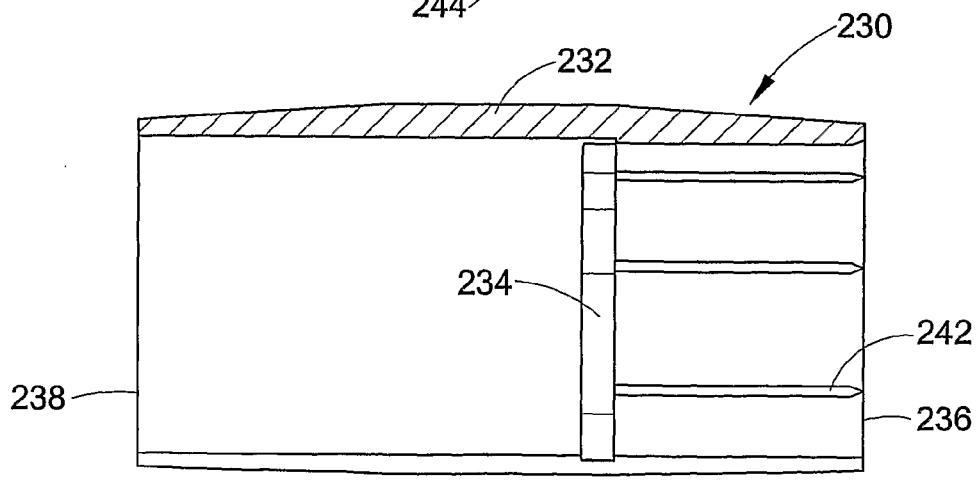
FIG. 12 is a longitudinal cross section of the couple of FIG. 11.

With reference to FIG. 11, a light guide couple 230 is used to couple two adjacent illumination devices 10 to one another. The light guide couple 230 includes a C-shaped wall 232 having at least one, and in the depicted embodiment two, internal stops 234 that extend inwardly from an internal surface of the C-shaped wall 232. The internal stops 234 are positioned normal to a longitudinal axis of the couple 230. As seen in FIG. 11, the internal stops are located closer to a first end 236 of the couple 230 than to a second end 238. The couple 230 includes longitudinal ridges 242 that extend inwardly from an inner surface of the wall 232 that run from the adjacent the internal stop 234 toward the first end 236. The internal surface of the wall 232 between the internal stop 234 and the second end 238 is smooth in the depicted embodiment. The smooth internal surface allows for a slip fit to allow for thermal expansion and contraction of at least one of the illumination-devices that are inserted into the couple 230. The wall includes a thickened central section that tapers to a relatively thinner section as the wall nears the ends 236 and 238 respectively. The wall 232 is shaped to receive adjacent illumination devices 10 such that the illumination devices are inserted into a channel 244 defined by the wall and an end of each, illumination device, abuts the internal stop 234. End caps (not shown) can also attach to an end of the illumination device 10.

Figure 13:
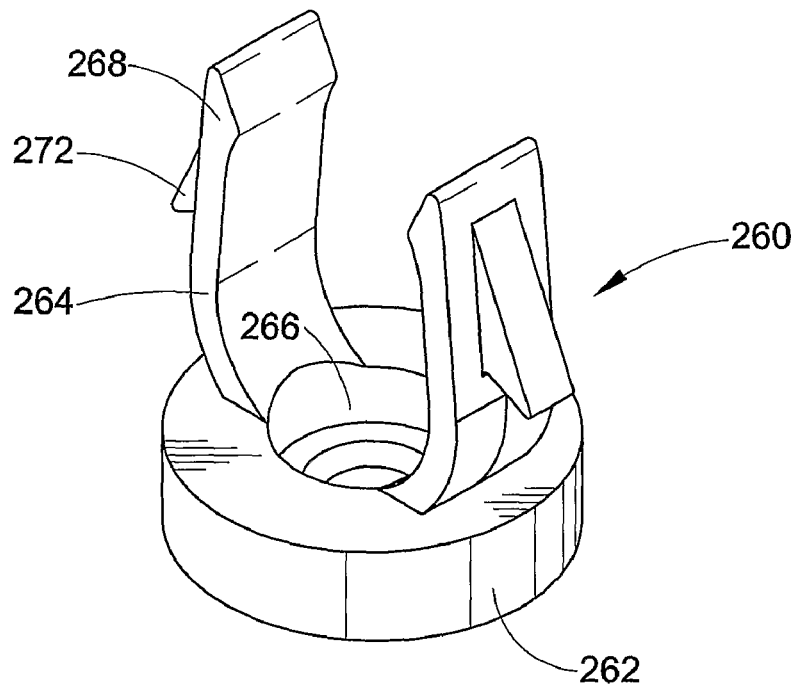
FIG. 13 is a perspective view of a mounting clip for mounting the illumination device of FIG. 1.
Figure 14:
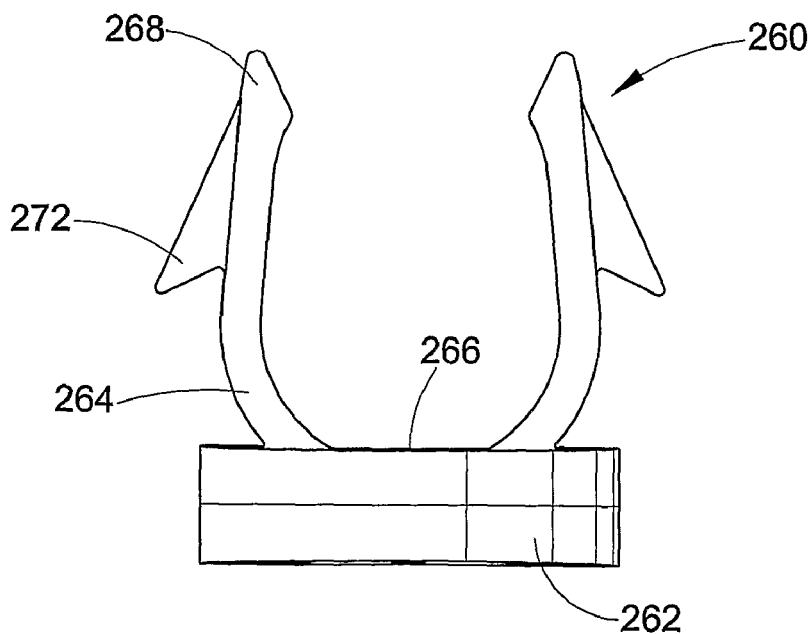
FIG. 14 is an elevation view of the mounting clip of FIG. 13.

With reference to FIG. 13, mounting clips 260 are provided to mount the illumination device to a desired surface. The mounting clip 260 includes a base 262 and a U-shaped retaining member 264 that extends from the base. The base 262 includes an opening 266 to receive a fastener (not shown) to fasten the mounting clip 260 to the desired surface. In the depicted embodiment, the opening 266 aligns with a counterbore that receives the head of the fastener so that the head sits flush with the surface of the base 262 from which the retaining member 264 extends. The retaining member 264 includes rounded pointed ends 268 to facilitate receipt of the illumination device 10 (FIG. 1). Flanges 272 extend outwardly from opposite side of the U-shaped retaining member 264.

Figure 15:
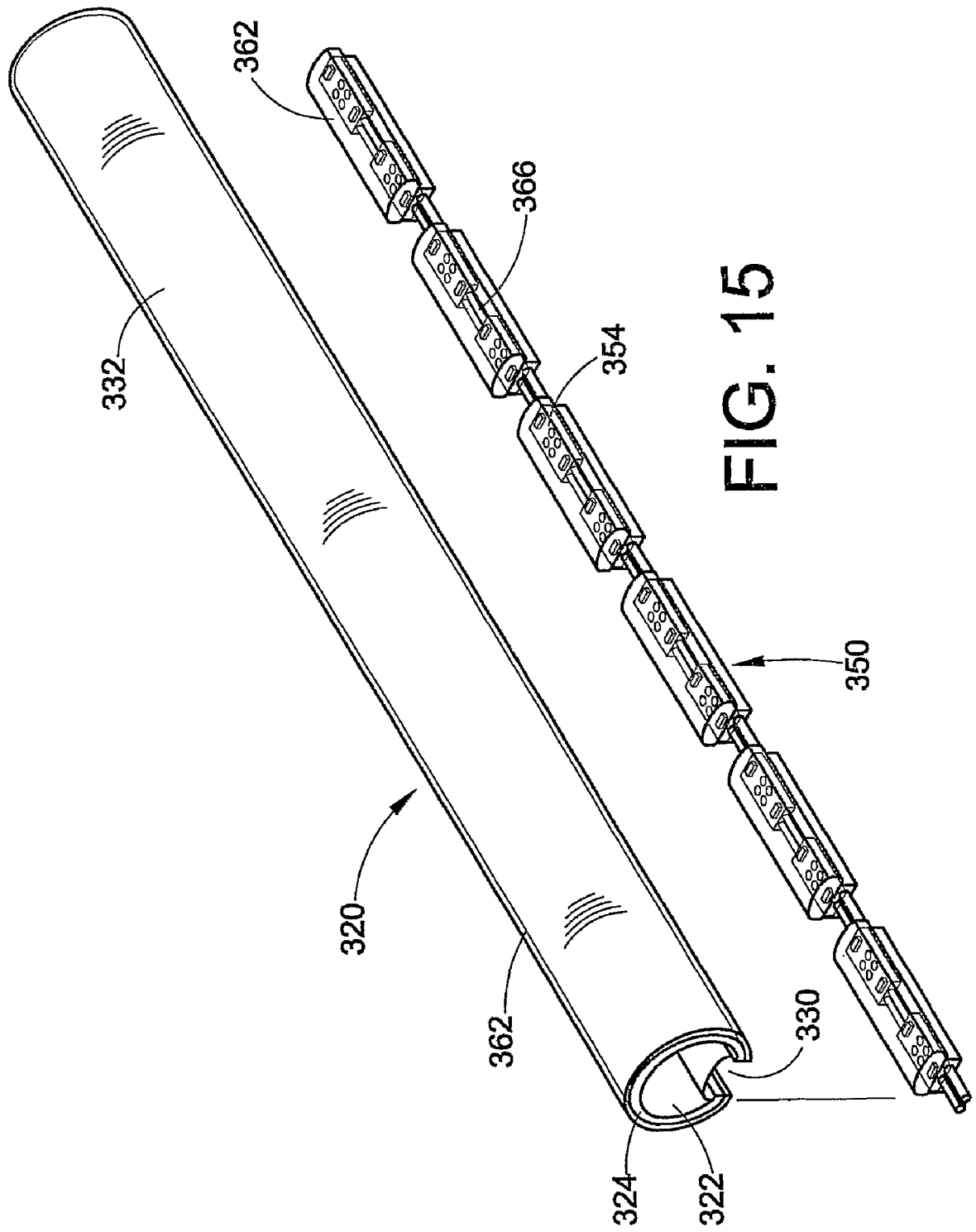
FIG. 15 is an exploded view of an alternative embodiment of an illumination device.
Figure 16:
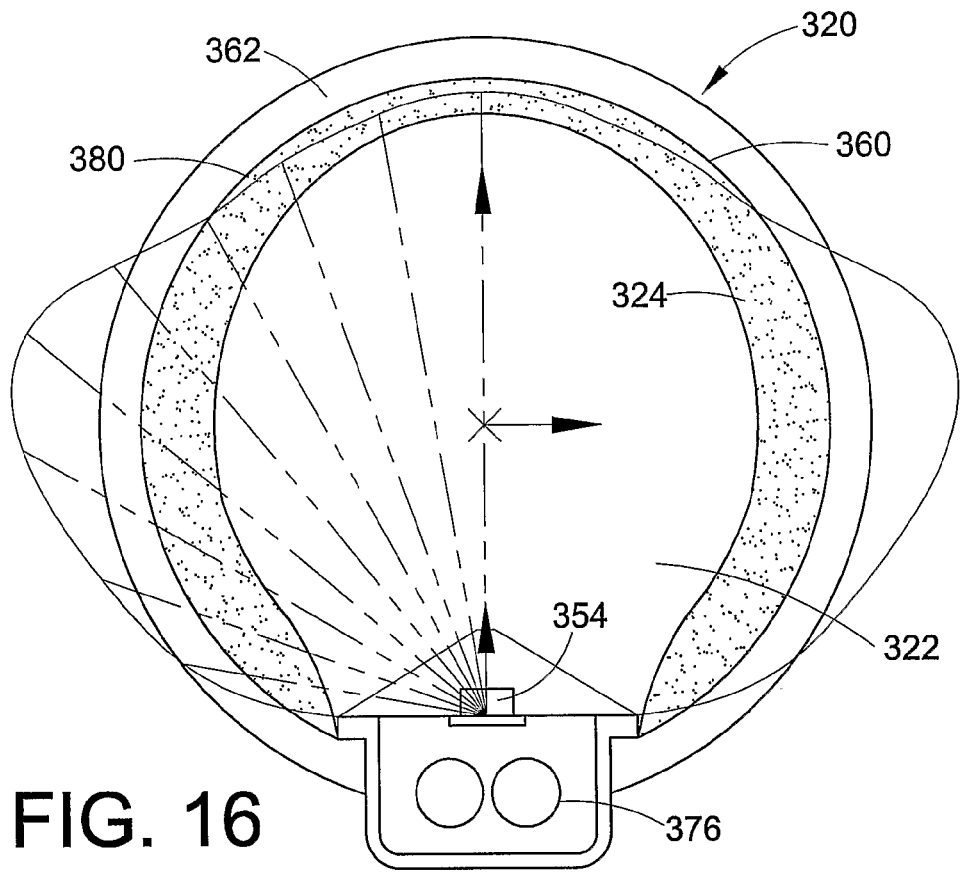
FIG. 16 is a schematic cross section the illumination device of FIG. 15.
Figure 17:
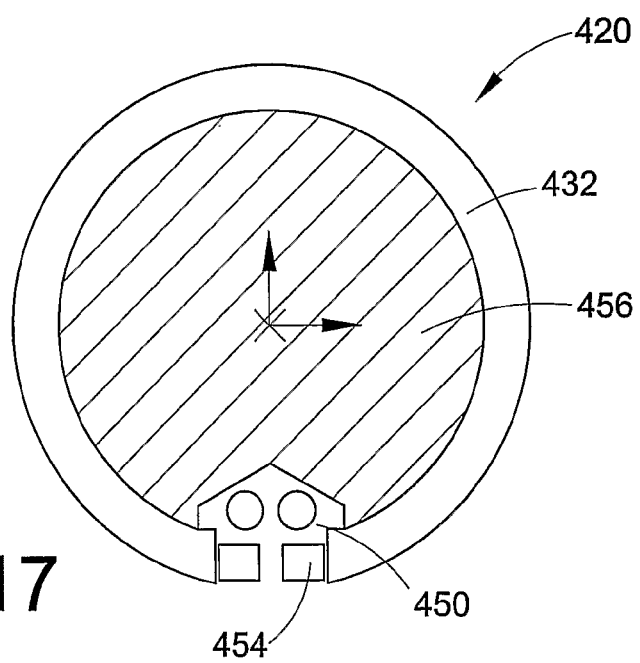
FIG. 17 is a schematic cross section of another alternative embodiment of an illumination device.

Alternative embodiments of illumination devices are depicted in FIGS. 15-17. The illumination devices depicted in FIGS. 15-17 can be sized similarly to a neon tube. In an embodiment depicted in FIG. 15, a light pipe 320 is a rigid but formable rod 332 having generally circular cross-section. In the embodiment depicted in FIG. 15, the rod 332 is comprised of multiple layers of material with different optical properties. In one embodiment, a base material 322 is preferably optically clear with good transmission and is extruded. A second layer, which in the described embodiment comprises a diffusing material 324, covers the base material 322. The second layer 324 coats on the base material via co-extrusion, over-molding or casting, or other plastic processing methods. The diffusing layer 324 can be varied in size, shape, thickness, and surface structure to achieve different desired effects such as viewing angle, uniformity, and intensity. In the embodiment depicted in FIG. 15, an optically clear material 362 covers the optically diffuse layer.

In the depicted embodiment, the layers of materials 322, 324 have similar physical properties and have similar glass transition temperatures. This allows the rod 332 to be shaped via heating without inducing high stresses in dissimilar layers or between layers. In the depicted embodiment, the layers 322, 324 also have similar coefficients of thermal expansion. This allows for proper functioning of rod 332 through temperature cycles without losing structural integrity. The layers 322, 324 also can have similar indexes of refraction to minimize the loses associated with light traveling from one medium to another.

The effect of the diffuse layer 324 immersed on the optically clear layer 322 is to simulate the appearance of gas inside a glass tube or the inside surface of a glowing neon tube. The rod 332 could optionally be made entirely of a optically diffuse material to achieve a uniform glow.

The rod 332 includes a groove 330, which in the depicted, embodiment runs along its entire length. The groove 330 is adapted to retain a flexible LED light engine 350 when the LED light engine 350 is inserted into the groove 330. The specific shape of the groove can be designed to mate features on the flexible LED light engine 350 to provide a frictional-fit or a snap-fit between the rod 332 and the flexible LED light engine 350. The groove 330 also positions the flexible LED light engine 350 in the proper location and orientation to achieve desirable results with respect to viewing angle, uniformity, and intensity of the illumination device.

In the embodiment depicted in FIG. 15, the flexible LED light engine 350 includes at least one LED 354 mounted on each of a plurality of circuit boards 364 that are connected via wire jumpers 366. Alternatively, the flexible LED light engine includes at least one LED mounted to a flexible circuit. In another alternative embodiment, the flexible LED light engine comprises at least one LED mounted to circuit board and insert into a connector that is attached to a multi-wire bus. In yet another alternative embodiment, the flexible LED light engine comprises at least one LED mounted to a leadframe. In the depicted embodiment, the light engine 350 includes a plurality of LEDs 354 connected in series/parallel, parallel, or parallel/series. Accordingly, the light engine 350 can operate on either a constant current or constant voltage.

In another embodiment, flexible LED light engine 350 is co-extruded into a continuous profile of flexible thermoplastic material, which in the depicted embodiment has properties similar to layers 322 and 324 of light guide 320.

Optionally, small sections of the LED light engine 350 can be overmolded with a low melt temperature, thermoplastic 362 to provide weather resistance. The overmold can provide a retention/locking element to interact with groove 330 in light guide 320. The thermoplastic 362 needs to have a melt temperature low enough to not damage the LEDs. The thermoplastic 362 can be either flexible, ductile, or rigid. Preferably, the thermoplastic 362 is clear and has an index of refraction that is similar to that of the epoxy used to mount the LEDs and that of light guide 320 to minimize losses.

In an alternative embodiment depicted in FIG. 17, a light guide 420 is a back lit light pipe 432 formed around a mandrel 456 that has a generally circular cross section and illuminated along it's length via a flexible LED light engine 450 with opposing LEDs 454 at each location or every other location that emit light directed toward the edge of light pipe 432. The LEDs 454 are preferably side-emitting LEDs. Forward emitting LEDs that are directed into the edge of light pipe 432 can also be used. Total internal reflection (TIR) is utilized to direct the emitted light through light pipe 432 around the circumference of the generally circular shape and radially outward from the light pipe 432 to achieve a uniform light appearance of the light guide around the circumference. This occurs at each LED location along the flexible LED light engine 450. Preferably, the LEDs 454 are spaced to achieve the desired uniformity along the length of light pipe 432.

In another alternative embodiment, a layer of material that contains one or more phosphur is included in the light guide to achieve custom colors. The phosphur preferably can be excited by either blue or UV LEDs. Preferably, the phosphur is a mono-, bi-, or tri-phosphur blend. Phosphur layer may be created by adding phosphur to the optically diffuse layer of material 324 or be a separate layer 360 (FIG. 16).

In another embodiment, flexible LED light engine could be comprised of a multi-wire electrical bus with power and signal conductors with LEDs of different or the same color to achieve desired visual effects such as chasing, color changing, or dynamic color control. In another embodiment, LED light engine can be co-extruded in center of light guide with LEDs facing in opposing directions to achieve a 360° viewing angle. In another embodiment, multiple LEDs per location aimed in different directions are used to increase viewing angle. In another embodiment, additional LEDs are aimed in the opposite direction of the light guide to provide back directed light output for a halo effect.

A user such as a sign manufacturer thermoforms the rod 332 into a desired shape using commonly available tools or equipment such as a PVC heating blanket, a heat gun, or a PVC heating box (not shown). This forming can be done either in a factory or at the site of installation. After heating the rod to a specific softening temperature or glass transition temperation, it can be, either free formed or placed in a template of the desired shape. Upon cooling the rod will retain the desired shape as well as the original cross-sectional shape and material properties. The flexible LED light engine 350 of the desired color or colors is then inserted into and retained in the groove 330 along the length of the formed rod 332. Alternatively, more than one light engine can be used. The system is then mounted and connected to a low voltage power supply via simple electrical connections. Preferably, the curvilinear LED light source has a viewing angle of 180° or greater including 360°.

An illumination device and a method for manufacturing and assembling the illumination device has been described with reference to certain embodiments. Modifications and alterations will occur to those upon reading and understanding the detailed description. The invention is not limited to only those embodiments described above; rather, the invention is defined by the appended claims and the equivalents thereof.

The invention claimed is:

1. A method of assembling an illumination device that simulates a neon light, the method comprising:
   heating and bending an elongated light guide into a desired configuration, the light guide defining a central axis; and
   attaching a flexible light engine to the light guide such that the light engine can selectively detach from the light guide by moving the light engine in a direction generally perpendicular to the central axis of the light guide, wherein the light engine comprises a plurality of LEDs connected to a flexible power conductor, wherein the light guide includes a channel adapted to receive the light engine, the method further comprising inserting a member into the channel prior to forming the light guide and removing the member from the channel prior to attaching the light engine to the light guide.

2. The method of claim 1, wherein the light guide includes a channel dimensioned to receive the light guide and the light engine includes a resilient housing for at least one LED, the attaching step further comprising inserting the light engine into the channel such that the resilient housing is compressed in the channel.

3. The method of claim 1, wherein the forming step comprises heating and bending the light guide.

4. An illumination device comprising:
   an elongated body having a longitudinal channel formed therein, the elongated body comprising a material adapted to bend into a number of desired configurations, the material also adapted to scatter and transmit light; and
   a light engine attached to the elongated body, the light engine comprising at least one LED, a flexible power conductor in electrical communication with the at least one LED, and a resilient housing for the at least one LED, wherein the resilient housing is at least partially received in the longitudinal channel of the elongated body, wherein the light engine is selectively removable from the longitudinal channel by moving the light engine in a direction that is generally perpendicular to a longitudinal axis of the elongated body; and
   a bending aid member adapted for selective insertion into the elongated body during heating and bending thereof.

5. The device of claim 4, wherein the elongated body includes a light emitting surface defined by a curved surface that transitions into at least one substantially planar surface.

6. The device of claim 4, wherein the flexible resilient housing includes a light emitting surface and the light guide elongated body includes a light entering surface having a complementary shape to the light emitting surface.

7. The device of claim 6, wherein the light emitting surface of the resilient housing abuts the light entering surfaces of the elongated body.

8. The device of claim 4, wherein the resilient housing is dimensioned to at least substantially fill the channel.

9. The device of claim 4, wherein the elongated body and the light engine are adapted to cooperate with one another to generate a light pattern having its greatest dimension at least substantially perpendicular to a longitudinal axis of the body.

10. An illumination device for simulating neon lighting, the device comprising:
    an elongated light guide comprising a material to diffuse and transmit light, the elongated light guide including a longitudinal channel;
    at least one printed circuit hoard ("PCB");
    a plurality of light emitting diodes ("LEDs") mounted on the at least one PCB; and
    a flexible overmolded housing substantially encapsulating each LED and PCB, the overmolded housing disposed inside the longitudinal channel and compressed to engage the light guide via a resilient fit.

11. The device of claim 10, wherein the light guide includes a body portion disposed between a light entering surface and a light exiting surface, the body portion having a mid-plane thickness t measured between the light entering surface and the light exiting surface through a longitudinal axis of the light guide, the light guide having a width w measured along a line that is perpendicular to t, the ratio t:w being less than about 0.75:1.

12. The device of claim 10, wherein the light guide includes a body portion having a height h and a width w that is measured perpendicular to the height h, the ratio of h:w being less than about 1.5:1.

13. The device of claim 10, wherein the housing is selectively removable from the longitudinal channel by moving the housing in a direction that is generally perpendicular to a longitudinal axis of the elongated light guide.

14. The device of claim 10, wherein the flexible housing includes a light emitting surface and the light guide includes a light entering surface having a complementary shape to the light emitting surface.

15. The device of claim 14, wherein the light emitting surface of the flexible housing abuts the light entering surface of the light guide.

16. The device of claim 15, wherein the flexible housing is dimensioned to at least substantially fill the channel.

17. An illumination device for simulating neon lighting, the device comprising:

an elongated light guide comprising a first extruded material and a second extruded material that covers the first extruded material, the elongated light guide including a longitudinal channel;
at least one printed circuit hoard ("PCB");
a plurality of light emitting diodes ("LEDs") mounted on the at least one PCB; and
a flexible overmolded housing substantially encapsulating each LED and PCB, the overmolded housing disposed inside the longitudinal channel and compressed to engage the light guide via a resilient fit.

18. The device of claim 17, wherein the second extruded material coats on the first extruded material via co-extrusion.

19. The device of claim 17, wherein at least one of the extruded materials comprises an optically clear material.

* * * * *